US012412504B2

(12) United States Patent
Geng

(10) Patent No.: US 12,412,504 B2
(45) Date of Patent: Sep. 9, 2025

(54) DISPLAY APPARATUS AND PANEL WITH FAN-OUT WIRING REDUCING BORDER WIDTH

(71) Applicant: TCL China Star Optoelectronics Technology Co., Ltd., Guangdong (CN)

(72) Inventor: Xin Geng, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 250 days.

(21) Appl. No.: 18/070,582

(22) Filed: Nov. 29, 2022

(65) Prior Publication Data

US 2024/0128183 A1 Apr. 18, 2024

(30) Foreign Application Priority Data

Oct. 14, 2022 (CN) .......................... 202211262381.1

(51) Int. Cl.
 *G09G 3/20* (2006.01)
(52) U.S. Cl.
 CPC ... *G09G 3/2092* (2013.01); *G09G 2320/0223* (2013.01)
(58) Field of Classification Search
 CPC ................ G09G 3/2092; G02F 1/1345; H01L 23/49838
 See application file for complete search history.

(56) References Cited

U.S. PATENT DOCUMENTS

| 10,056,446 | B2 | 8/2018 | Kim et al. |
| 11,567,377 | B2 | 1/2023 | Hsu et al. |
| 2010/0283955 | A1* | 11/2010 | Kim ...................... G02F 1/1345 349/149 |
| 2021/0055616 | A1* | 2/2021 | Hsu ........................ G02F 1/1345 |
| 2024/0127734 | A1* | 4/2024 | Su ......................... G09G 3/3275 |

FOREIGN PATENT DOCUMENTS

| CN | 107154416 | 9/2017 |
| CN | 112415817 | 2/2021 |

OTHER PUBLICATIONS

Notification of Office Action and Search Report Dated Feb. 25, 2025 From The State Intellectual Property Office of the People's Republic of China Re. Application No. 202211262381.1 and Its Translation Into English. (15 Pages).

* cited by examiner

*Primary Examiner* — Liliana Cerullo

(57) ABSTRACT

A display apparatus and a display panel are disclosed. The display panel includes a display area, a driving area, and a fan-out area provided with a plurality of fan-out wirings and at least including a first section wiring connected with data signal terminals, a second section wiring connected with the first section wiring, and a third section wiring connected with the second section wiring. The fan-out wirings are close to a central axis of the driving area, so that a difference between lengths of the first section wirings on both sides and a length of the first section wiring close to the central axis is reduced, thus effectively shortening the length of the first section wiring close to the central axis when the first section wiring on both sides maintains a predetermined length, therefore, the fan-out area is compressed and a width of the display panel border is shortened.

16 Claims, 5 Drawing Sheets

DISPLAY APPARATUS AND PANEL WITH FAN-OUT WIRING REDUCING BORDER WIDTH

RELATED APPLICATION

This application claims the benefit of priority of Chinese Patent Application No. 202211262381.1 filed on Oct. 14, 2022, the contents of which are incorporated by reference as if fully set forth herein in their entirety.

FIELD AND BACKGROUND OF THE INVENTION

The present application relates to a technical field of display, and specifically to a display apparatus and a display panel thereof.

In related technologies, output wirings in an output area of a display panel generally adopts a way shown in FIG. 1. One end of a straight fan-out wiring 210' is directly connected with a data signal line 110', and another end is directly connected with a data signal terminal 310', so as to realize connection between the data signal terminal 310' and the data signal line 110'. However, with technical development of a full-screen display screen, screen proportion of the display screen is constantly increasing, and a lower border of the display screen is becoming less and less. This wiring mode has become one of factors that restrict narrowing of the lower border of the display screen.

SUMMARY OF THE INVENTION

The embodiment of the application provides a display apparatus and a display panel thereof, which can narrow a lower border without affecting resistance of fan-out wirings.

A display panel is provided in an embodiment of the present application, the display panel at least comprises a display area, a fan-out area, and a driving area; the fan-out area is arranged on one side of the display area, the driving area is arranged on one side of the fan-out area away from the display area, and the fan-out area is connected with the driving area and the display area; the display panel further comprises:

a plurality of data signal lines located in the display area;
a plurality of data signal terminals located in the driving area; and
a plurality of fan-out wirings located in the fan-out area; the fan-out wirings are connected with the data signal lines and the data signal terminals in one-to-one correspondence; wherein, the fan-out wirings at least comprise a first section wiring, a second section wiring, and a third section wiring; the first section wiring is connected with the data signal terminals, the third section wiring is connected with the data signal lines, and the second section wiring is connected with the first section wiring and the third section wiring; the third section wiring extends from the display area to the driving area along a direction close to a central axis of the display panel, an extending direction of the first section wiring and an extending direction of the second section wiring are different, and the extending direction of the second section wiring and an extending direction of the third section wiring are different.

In some embodiments of the present application, an orthogonal projection length of each third section wiring on a reference line coplanar with the third section wiring is less than a distance between adjacent two data signal lines; wherein an extending direction of the reference line is perpendicular to an extending direction of the central axis of the display panel.

In some embodiments of the present application, each fan-out wiring further comprises a fourth section wiring, and the fourth section wiring is connected with the second section wiring and the third section wiring; the fourth section wiring of each fan-out wiring is arranged in parallel along a first direction, and the first direction is directed from the display area to the driving area.

In some embodiments of the present application, a first endpoint of the fourth section wiring of each fan-out wiring is located on a first straight line extending along a second direction, a second endpoint of the fourth section wiring of each fan-out wiring is located on a second straight line extending along the second direction, and the second direction intersects the first direction.

In some embodiments of the present application, the plurality of fan-out wirings comprise a plurality of fan-out wiring groups symmetrical about the central axis of the display panel; in at least one fan-out wiring group, the second section wiring of each fan-out wiring is arranged in parallel, and the central axis coincides with a central line of the fan-out area and the driving area.

In some embodiments of the present application, in at least one fan-out wiring group, in the direction close to the central axis, lengths of the first section wirings of at least two fan-out wirings increase progressively.

In some embodiments of the present application, in at least one fan-out wiring group, the first section wirings of the fan-out wirings are arranged at equal intervals, the second section wirings of the fan-out wirings are arranged at equal intervals, and the fourth section wirings of the fan-out wirings are arranged at equal intervals.

In some embodiments of the present application, in at least one fan-out wiring group, a first distance between the first section wirings of adjacent two fan-out wirings is less than a second distance between the fourth section wirings of the adjacent two fan-out wirings, and the second distance is less than a third distance between wiring portions of the adjacent two fan-out wirings.

In some embodiments of the present application, a fourth distance of the second section wirings of the adjacent two fan-out wirings is less than the first distance of the first section wirings of the adjacent two fan-out wirings.

Accordingly, a display apparatus is further provided in the embodiment of the present application, the display apparatus comprises:

a shell;
a display panel mounted on the shell and at least comprising a display area, a fan-out area, and a driving area; the fan-out area is arranged on one side of the display area, the driving area is arranged on one side of the fan-out area away from the display area, and the fan-out area is connected with the driving area and the display area; the display panel further comprises:
a plurality of data signal lines located in the display area;
a plurality of data signal terminals located in the driving area; and
a plurality of fan-out wirings located in the fan-out area; the fan-out wirings are connected with the data signal lines and the data signal terminals in one-to-one correspondence; wherein, the fan-out wirings at least comprise a first section wiring, a second section wiring, and a third section wiring; the first section wiring is connected with the data signal terminals, the third section wiring is connected with the data signal lines, and the second section wiring is connected with the first section wiring and the third section wiring; the third section wiring extends from the display area to the driving area along a direction close to a central axis of the display panel, an extending direction of the first section wiring and an extending direction of the second section wiring are different, and the extending direction of the second section wiring and an extending direction of the third section wiring are different.

In some embodiments of the present application, an orthogonal projection length of each third section wiring on a reference line coplanar with the third section wiring is less than a distance between adjacent two data signal lines; wherein an extending direction of the reference line is perpendicular to an extending direction of the central axis of the display panel.

In some embodiments of the present application, each fan-out wiring further comprises a fourth section wiring, and the fourth section wiring is connected with the second section wiring and the third section wiring; the fourth section wiring of each fan-out wiring is arranged in parallel along a first direction, and the first direction is directed from the display area to the driving area.

In some embodiments of the present application, a first endpoint of the fourth section wiring of each fan-out wiring is located on a first straight line extending along a second direction, a second endpoint of the fourth section wiring of each fan-out wiring is located on a second straight line extending along the second direction, and the second direction intersects the first direction.

In some embodiments of the present application, the plurality of fan-out wirings comprise a plurality of fan-out wiring groups symmetrical about the central axis of the display panel; in at least one fan-out wiring group, the second section wiring of each fan-out wiring is arranged in parallel, and the central axis coincides with a central line of the fan-out area and the driving area.

In some embodiments of the present application, in at least one fan-out wiring group, in the direction close to the central axis, lengths of the first section wirings of at least two fan-out wirings increase progressively.

In some embodiments of the present application, in at least one fan-out wiring group, the first section wirings of the fan-out wirings are arranged at equal intervals, the second section wirings of the fan-out wirings are arranged at equal intervals, and the fourth section wirings of the fan-out wirings are arranged at equal intervals.

In some embodiments of the present application, in at least one fan-out wiring group, a first distance between the first section wirings of adjacent two fan-out wirings is less than a second distance between the fourth section wirings of the adjacent two fan-out wirings, and the second distance is less than a third distance between wiring portions of the adjacent two fan-out wirings.

In some embodiments of the present application, a fourth distance of the second section wirings of the adjacent two fan-out wirings is less than the first distance of the first section wirings of the adjacent two fan-out wirings.

In the embodiments of the present application, fan-out wirings with fewer bends in prior art are modified into the fan-out wirings with lots of bends, so that the fan-out wirings are close to a central axis of the driving area, so that a difference between lengths of the first section wirings on both sides and a length of the first section wiring close to one side of the central axis is reduced, thus effectively shortening the length of the first section wiring close to the one side of the central axis when the first section wiring on both sides maintains a predetermined length, so that the fan-out area is compressed, and the driving area can be set closer to the display area, which effectively shortens a width of the display panel border. To some extent, it solves a technical problem of the wiring mode in the prior art that affects narrowing of the lower border of a display, and realizes the narrowing of the lower border without affecting a wiring width and wiring resistance. After the fan-out area is compressed, space on both sides of the fan-out wirings increases, which can increase wiring space of other wirings, and appropriately increase the wiring width of other wirings to reduce the resistance.

BRIEF DESCRIPTION OF THE SEVERAL VIEWS OF THE DRAWINGS

To illustrate technical solutions in an embodiment of the present application more clearly, accompanying drawings used in a description of the embodiments are briefly introduced as follows. Obviously, the accompanying drawings in the following description are only some embodiments of the present application. For those skilled in the art, other drawings can also be obtained from these drawings without creative effort.

DESCRIPTION OF DRAWINGS LABELS

Figure 1:
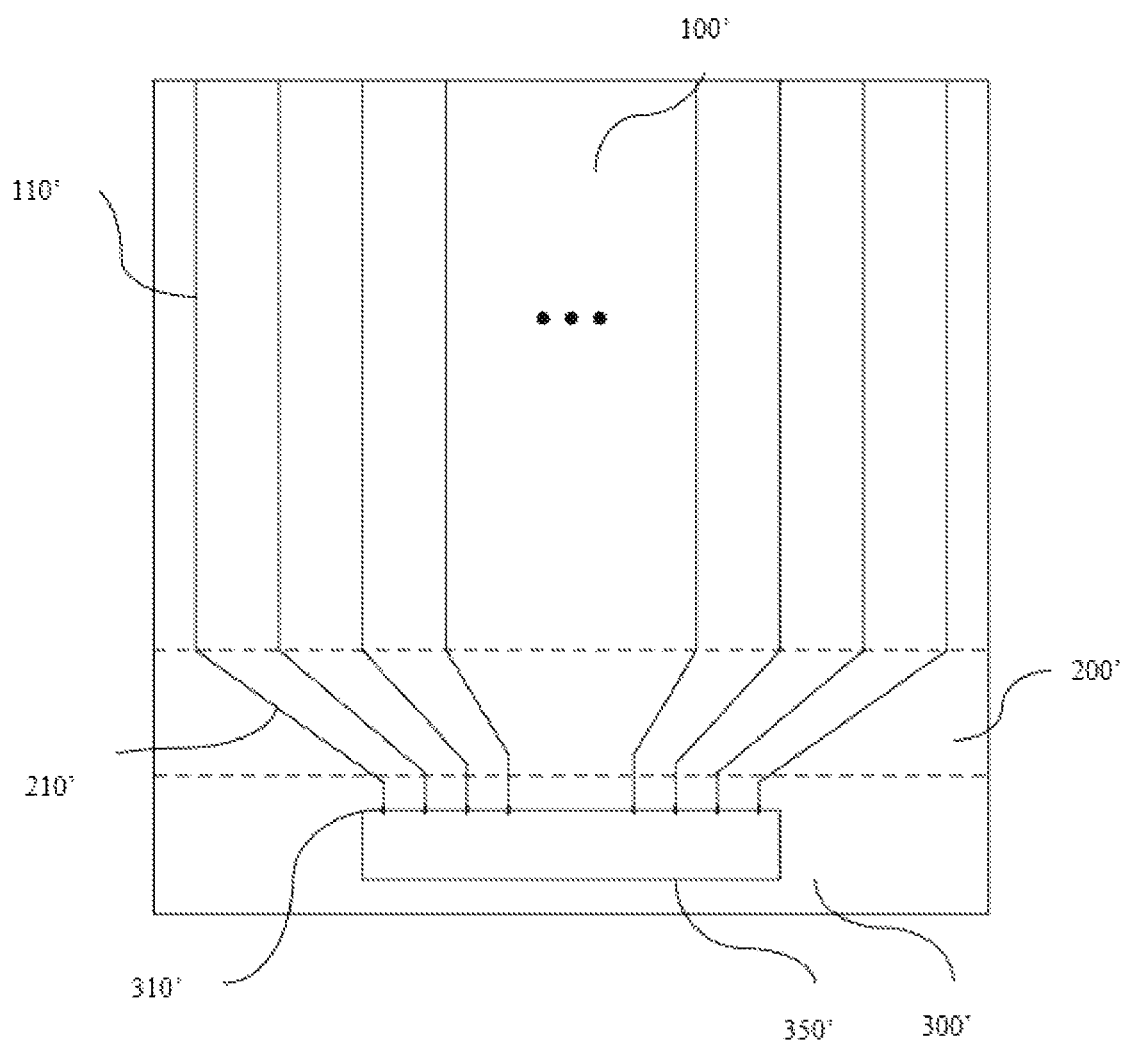
FIG. 1 is a wiring arrangement schematic diagram of a display panel in the prior art in the present application.

10 shell; 20 display panel; 100,100' display area; 200,200' fan-out area; 300,300' driving area; 400 electrostatic discharge protection area; 110,110' data signal line; 111 main portion; 112 wiring portion; 120 common signal line; 130 control signal line; 210,210' fan-out wiring; 220 common wiring; 230 signal control wiring; 240 signal conversion circuit; 250 conversion wiring; 201 first fan-out wiring group; 202 second fan-out wiring group; 203 common wiring group; 204 signal control wiring group; 211 first section wiring; 212 second section wiring; 213 third section wiring; 214 fourth section wiring; α first fan-out angle; β second fan-out angle; 310,310' data signal terminal; 320 common signal terminal; 351 central axis; 330 control signal terminal; 350,350' driving circuit.

DESCRIPTION OF SPECIFIC EMBODIMENTS OF THE INVENTION

Technical solutions in embodiments of the present application will be clearly and completely described below with reference to accompanying drawings in the embodiments of the present application. Obviously, described embodiments are only some, but not all embodiments of the present application. Based on the embodiments of the present application, all other embodiments obtained by those skilled in the art without creative efforts shall fall within protection scope of the present application. In addition, it should be understood that the specific embodiments described here are only used to explain and interpret the present application and are not used to limit the present application. In the present application, location words used, such as "up" and "down", generally refer to up and down of a device in actual use or working state, in particular the drawing direction in the drawings, without any description to the contrary; and the words "inside" and "outside" refer to an outline of the device.

A display apparatus and a display panel 20 thereof are provided in the embodiments of the present application. The details are as follows. It should be noted that, a description order of the following embodiments is not used to define a preferred order of the embodiments.

A display apparatus is provided in the present application, and the display apparatus can be mounted on products with lots of display functions. For example, electronic products can be intelligent terminals, laptops, photographic equipment, wearable devices, electronic scales, vehicle mounted displays, televisions, etc.

Please refer to FIG. 1, FIG. 1 is a wiring arrangement schematic diagram of a display panel in the prior art in the present application. In the prior art, the display panel includes a display area 100', a fan-out area 200', and a driving area 300'. The fan-out area 200' is arranged on one side of the display area 100', the driving area 300' is arranged on one side of the fan-out area 200' away from the display area 100', and the fan-out area 200' is connected with the driving area 300' and the display area 100'.

The display panel further includes a plurality of data signal lines 110', a plurality of data signal terminals 310', and a plurality of fan-out wirings 210'. The data signal lines 110' and the fan-out wirings 210' are connected with the data signal terminals 310' in one-to-one correspondence. One end of each fan-out wiring 210' is connected with the data signal line 110', and another end of each fan-out wiring 210' is connected with an electrical signal of the data signal terminal 310'.

The data signal terminals 310' are located in the driving area 300' and each acts as a wiring end of a driving circuit 350' in the driving area 300'. The fan-out wirings 210' are connected with an electrical signal of the driving circuit 350' through the data signal terminals 310'.

The data signal lines 110' are located in the display area 100', and the driving circuit 350' is connected with the data signal lines 350' through the fan-out wirings 210', and controls lighting of each sub-pixel in the display area 100' through the data signal lines 110'.

The fan-out wirings 210' are located in the fan-out area 200'. In the prior art, one end of one fan-out wiring 210' with straight ends and bent at a middle section is directly connected with the data signal line 110', and another end is directly connected with the data signal terminal 310' to realize connection between the data signal terminal 310' and the data signal line 110'.

Figure 2:
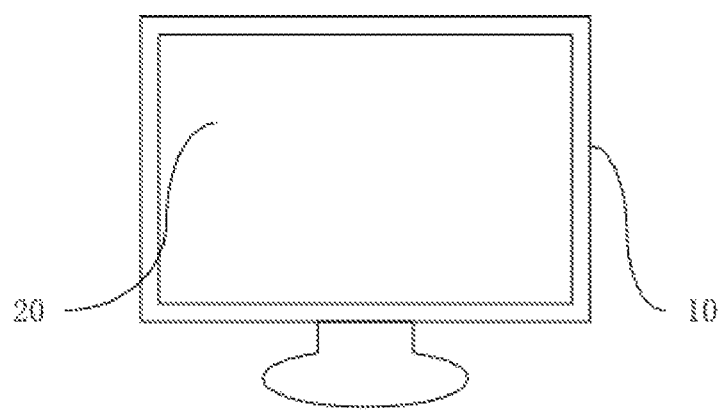
FIG. 2 is a structural schematic diagram of a display apparatus provided in an embodiment of the present application.

Please refer to FIG. 2, the display apparatus includes a shell 10 and a display panel mounted on the shell 10.

Figure 3:
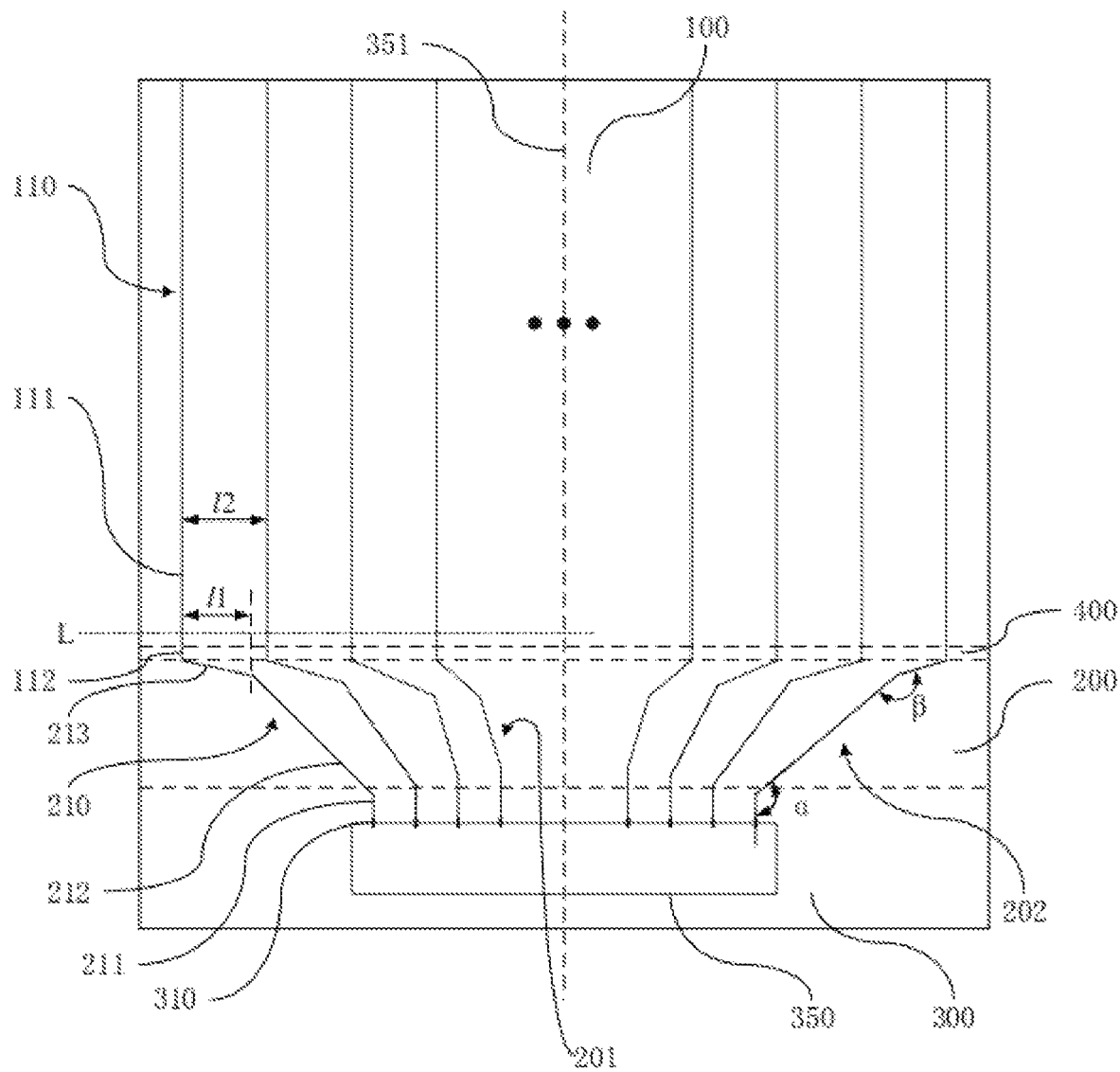
FIG. 3 is a wiring arrangement schematic diagram of a display panel provided in one embodiment of the present application.

Please refer to FIG. 3 in combination, the display panel 20 in the embodiment of the present application at least includes a display area 100, a fan-out area 200, and a driving area 300. The fan-out area 200 is arranged on one side of the display area 100, the driving area 300 is arranged on one side of the fan-out area 200 away from the display area 100, and the fan-out area 200 is connected with the driving area 300 and the display area 100. The display panel 20 further includes:

a plurality of data signal lines 110, the data signal lines 110 are located in the display area 100;
a plurality of data signal terminals 310, the data signal terminals 310 are located in the driving area 300; and
a plurality of fan-out wirings 210, the fan-out wirings 210 are located in the fan-out area 200. The fan-out wirings 210 are connected with the data signal lines 110 and the data signal terminals 310 in one-to-one correspondence. Wherein, the fan-out wirings 210 at least include a first section wiring 211 connected with the data signal terminal 310, a third section wiring 213 connected with the data signal line 110, and a second section wiring 212 connected with the first section wiring 211 and the third section wiring 213. The third section wiring 213 extends along a direction close to a central axis of the display panel 20 from the display area 100 to the driving area 300. An extending direction of the first section wiring 211 and an extending direction of the second section wiring 212 are different, and the extending direction of the second section wiring 212 and an extending direction of the third section wiring 213 are different.

With the above-mentioned structure, the embodiment of the present application modifies the fan-out wiring 210' with fewer bends to the fan-out wiring 210 with lots of bends, so that the fan-out wirings 210 are close to a central axis of the driving area, so that a difference between lengths of the first section wirings 211 on both sides and a length of the first section wiring 211 close to one side of the central axis is reduced, thus effectively shortening the length of the first section wiring 211 close to the one side of the central axis when the first section wiring 211 on both sides maintains a predetermined length, so that the fan-out area 200 is compressed, and the driving area 300 can be set closer to the display area 100, which effectively shortens a width of the display panel border. To some extent, it solves a technical problem of the wiring mode in the prior art that affects narrowing of the lower border of a display, and realizes the narrowing of the lower border without affecting a wiring width and wiring resistance. After the fan-out area 200 is compressed, space on both sides of the fan-out wirings 210 increases, which can increase wiring space of other wirings (for example, CK clock signal wirings of chip on film (COF) coated film connected to gate on array (GOA) circuit), and appropriately increase the wiring width of other wirings to reduce the resistance.

In some embodiments of the present application, an orthographic projection length 11 of each third section wiring 213 on a reference line L coplanar with the third section wiring 213 is less than a distance 12 between adjacent two data signal lines 110. Wherein an extending direction of the reference line L is perpendicular to an extending direction of the central axis 351 of the display panel 20, that is, the extending direction of the reference line is a horizontal transverse direction in FIG. 3.

Such a wiring mode can prevent a density of the third section wiring 213 from being too large, so that the wiring width needs to be reduced, resulting in increased wiring resistance.

In some embodiments of the present application, the display panel 20 further includes an electrostatic discharge protection area 400. The electrostatic discharge protection area 400 is arranged on one side of the display area 100, and the fan-out area 200 is arranged on one side of the electrostatic discharge protection area 400 away from the display area 100.

In some embodiments of the present application, the data signal line 110 includes a main portion 111 located in the display area 100 and a wiring portion 112 located in the electrostatic discharge protection area 400. The wiring portion 112 is connected with the fan-out wiring 210, and is connected with the driving circuit 350 through the fan-out wiring 210, so that the driving circuit 350 controls the lighting of each sub-pixel in the display area 100 through the data signal line 110. Wherein, the wiring portions 112 of at least two data signal lines 110 are of equal length.

Figure 4:
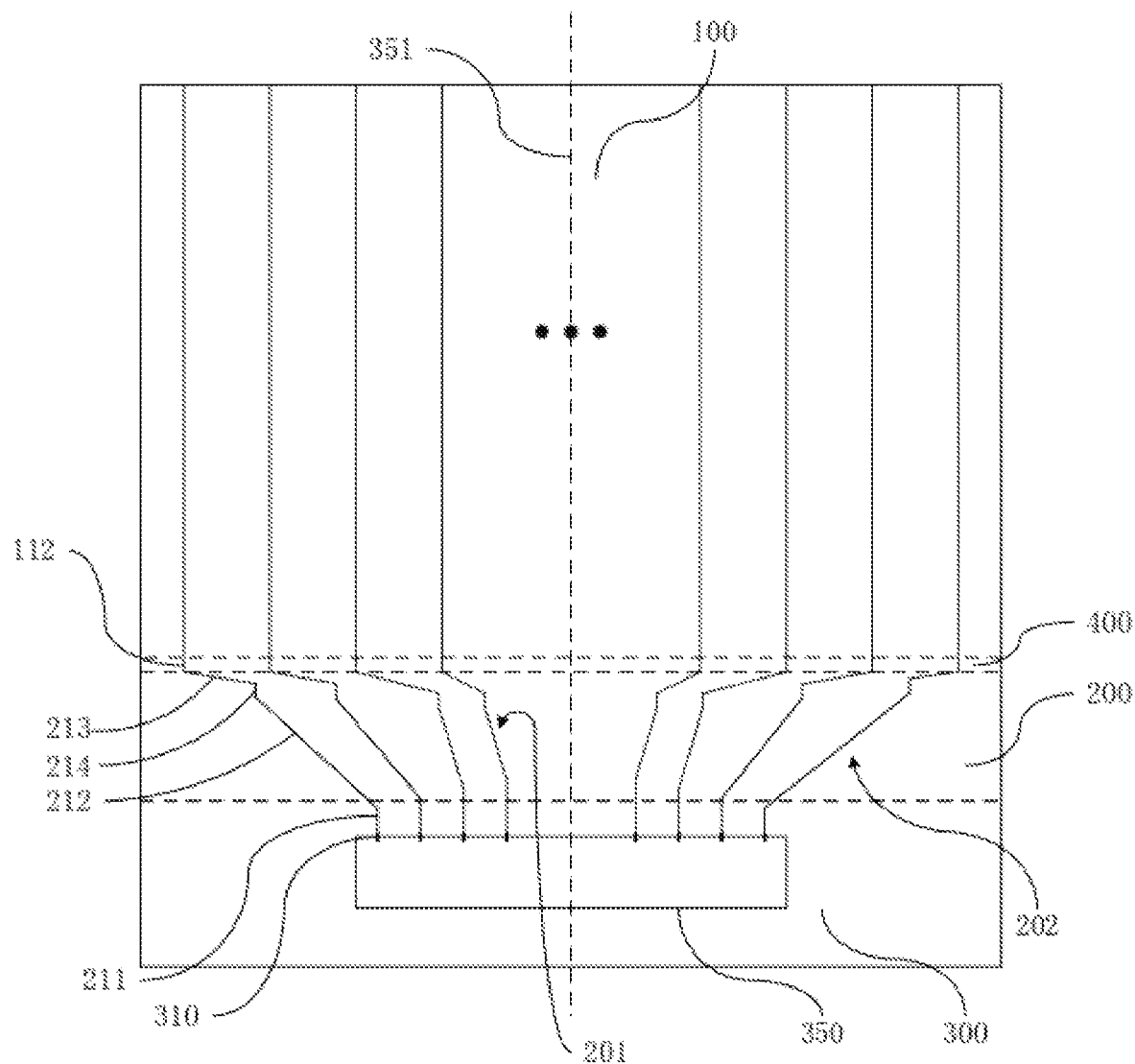
FIG. 4 is a wiring arrangement schematic diagram of the display panel provided in another embodiment of the present application.

In some embodiments of the present application, please refer to FIG. 4 in combination, the above-mentioned fan-out wirings 210 further include a fourth section wiring 214. The fourth section wiring 214 is connected with the second section wiring 212 and the third section wiring 213. The fourth section wirings 214 of each fan-out wiring 210 are arranged in parallel along a first direction. The first direction is directly from the display area 100 to the driving area 300, that is, a vertical direction.

Specifically, one end of the fourth section wiring 214 is bent and connected with the second section wiring 212, and another end is bent and connected with the third section wiring 213, so that the second section wiring 212 is bent and connected with the third section wiring 213.

A first endpoint of the fourth section wiring 214 of each fan-out wiring 210 is located on a first straight line extending along a second direction, that is, a horizontal direction, and a second endpoint of the fourth section wiring 214 of each fan-out wiring 210 is located on a second straight line extending along the second direction, that is, the horizontal direction. Then the fourth section wiring 214 of each fan-out wiring 210 extends from the first straight line to the second straight line along the first direction, that is, the vertical direction; and then, the fourth section wirings 214 of each fan-out wirings 210 are flush with each other and arranged in parallel with each other. Wherein, the second direction intersects the first direction.

The fourth section wiring 214 is used to calibrate endpoints of the second section wiring 212 and the third section wiring 213, so as to ensure that the second section wiring 212 can be bent and connected with the third section wiring 213.

The fan-out wirings 210 are located in the fan-out area 200, and the plurality of fan-out wirings 210 forms a plurality of fan-out wiring groups symmetrical about the central axis 351, in the embodiment, including a first fan-out wiring group 201 and a second fan-out wiring group 202. The first fan-out wiring group 201 and the second fan-out wiring group 202 are respectively distributed on both sides of the central axis 351 and symmetrical about the central axis 351.

In the first fan-out wiring group 201 and/or the second fan-out wiring group 202, the second section wirings 212 of each fan-out wiring are arranged in parallel with each other. The central axis 351 coincides with a central line of the fan-out area 200 and the driving area 300. Moreover, in the direction close to the central axis, lengths of the first section wirings 211 of at least two fan-out wirings increase progressively.

In the first fan-out wiring group 201 and/or the second fan-out wiring group 202, the first section wirings 211 of each fan-out wiring are arranged at equal intervals, the second section wirings 212 of each fan-out wiring are arranged at equal intervals, and the fourth section wirings 214 of each fan-out wiring are arranged at equal intervals.

Through the above-mentioned fan-out wiring mode, the fan-out wirings can be more regular, which is conducive to further compressing the fan-out area.

In some embodiments of the present application, a distance between the first section wiring 211 of the fan-out wiring 210 and the central axis 351, a distance between the fourth section wiring 214 and the central axis 351, and a distance between the wiring portion 112 and the central axis 351 decrease in sequence. The first section wiring 211 of the fan-out wiring 210 is closer to the central axis 351 than the corresponding connected wiring portion 112.

Specifically, a first distance between the first section wirings 211 of adjacent two fan-out wirings is less than a second distance between the fourth section wirings 214 of the adjacent two fan-out wirings. And the second distance is less than a third distance between the wiring portions 112 of adjacent two data signal lines 110.

In some embodiments of the present application, one end of the first section wiring 211 is connected with the data signal terminal 310, and another end is bent and connected with the second section wiring 212. A first fan-out angle α is formed through the first section wiring 211 bending and connecting the second section wiring 212. One end of the wiring portion 112 is connected with the main portion 111 of the data signal line 110, and another end is bent and connected with the third section wiring 213. A second fan-out angle β is formed through the second section wiring 212 bending and connecting the third section wiring 213. The second section wiring 212 is bent and connected with the third section wiring 213. The first fan-out angle α and the second fan-out angle β are both obtuse angles, the first fan-out angle α is less than the second fan-out angle β. In this way, the fan-out area 200 can be further compressed to narrow the lower border.

The first section wirings 211 of each fan-out wiring 210 are arranged along the first direction, that is, the vertical direction, consistent with an extending direction of the data signal line 110. The length of each first section wiring 211 gradually increases along a direction from one side close to the central axis 351 to one side away from the central axis 351.

In some embodiments of the present application, a maximum length of the first section wiring 211 is 50 microns and a minimum length thereof is 10 microns. The first section wirings 211 of each fan-out wiring 210 belonging to a same fan-out wiring group are parallel to each other and arranged at equal intervals. The first distance between the first section wirings 211 of the adjacent two fan-out wirings 210 is 20 microns.

The wiring portions 112 of each data signal line 110 are also arranged along the first direction, that is, the vertical direction. The wiring portions 112 of each data signal line 110 are of a same length and aligned with each other. In some embodiments of the present application, the length of the wiring portion 112 is 20 microns. The wiring portions 112 of each fan-out wiring 210 belonging to the same fan-out wiring group are parallel to each other and arranged at equal intervals, and the third distance between the adjacent two wiring portions 112 is 90 microns.

In some embodiments of the present application, the second section wirings 212 of each fan-out wiring 210 belonging to the same fan-out wiring group are parallel to each other and arranged at equal intervals, and the fourth distance between two adjacent second sections wirings 212 is 10 microns. The fourth distance is less than the first distance between the adjacent two first section wirings 211, so that each fan-out wiring group takes up less space in the display area 100, thus making the fan-out area 200 release more space.

In some embodiments of the present application, the length of the fourth section wiring 214 is 5 microns. The fourth section wirings 214 of each fan-out wiring 210 belonging to the same fan-out wiring group are parallel to each other and arranged at equal intervals, and the second distance between the adjacent two fourth section wiring 214 is 25 microns. The second distance is greater than the first distance between the adjacent two first section wirings 211, and less than the third distance between the adjacent two wiring portions 112.

Figure 5:
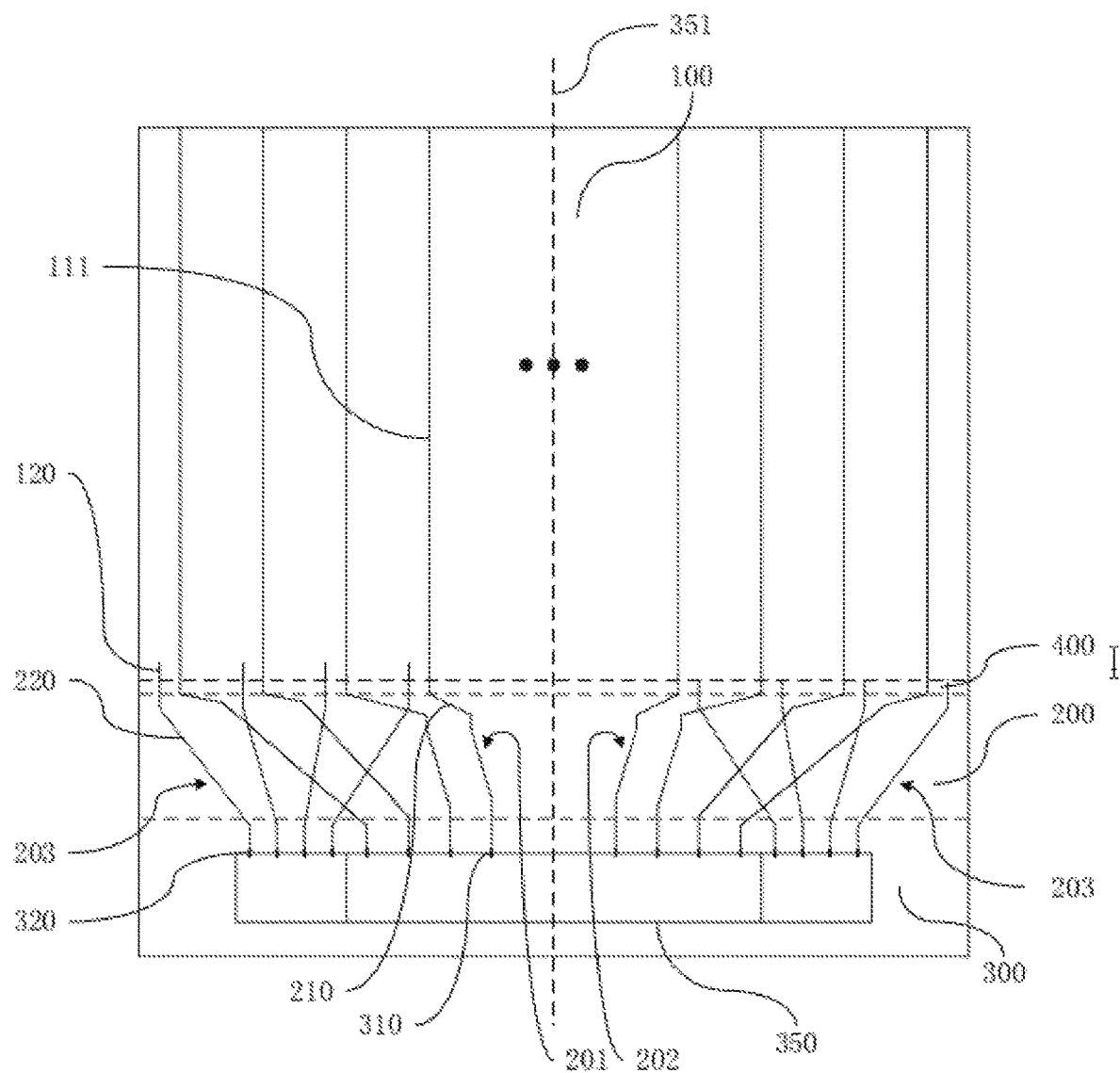
FIG. 5 is a wiring arrangement schematic diagram of the display panel provided in another embodiment of the present application.

In some embodiments of the present application, please refer to FIG. 5 in combination, the above-mentioned display panel further includes a plurality of common signal lines 120, a plurality of common signal terminals 320, and a plurality of common wirings 220. The common signal lines 120 and the common signal terminals 320 are in one-to-one correspondence with the common wirings 220. One end of each common wiring 220 is connected with the common signal line 120, and another end is connected with an electrical signal of the common signal terminal 320.

The common signal terminals 320 are located in the driving area 300, and each of them acts as a wiring end of the driving circuit 350 in the driving area 300. The common wirings 220 are connected with an electrical signal of the driving circuit 350 through the common signal terminals 320. The common signal terminals 320 are vertically arranged on one side of the driving circuit 350 in parallel, which are also located on one side of the driving circuit 350 facing the display area 100, and on both sides of the data signal terminals 310. In other embodiments, the common signal terminals 320 can also be arranged on one side of the driving circuit 350 away from the display area 100.

The common signal lines 120 are located in the display area 100, and the common signal lines 120 are connected with an electrical signal of a common electrode in the display area 100.

The common wirings 220 are located in the fan-out area 200. One end of each common wiring 220 is connected with the common signal terminal 320, another end is connected with the common signal line 120, so as to realize electrical connection between the common signal terminal 320 and the common signal line 120.

The plurality of common wirings 220 form a plurality of common wiring groups 203. The common wiring groups 203 are arranged on side of the first fan-out wiring group 201 away from the second fan-out wiring group 202 and one side of the second fan-out wiring group 202 away from the first fan-out wiring group 201. The driving circuit 350 can transmit a common signal to the common electrode in the display area 100 through the common wiring groups 203.

Figure 6:
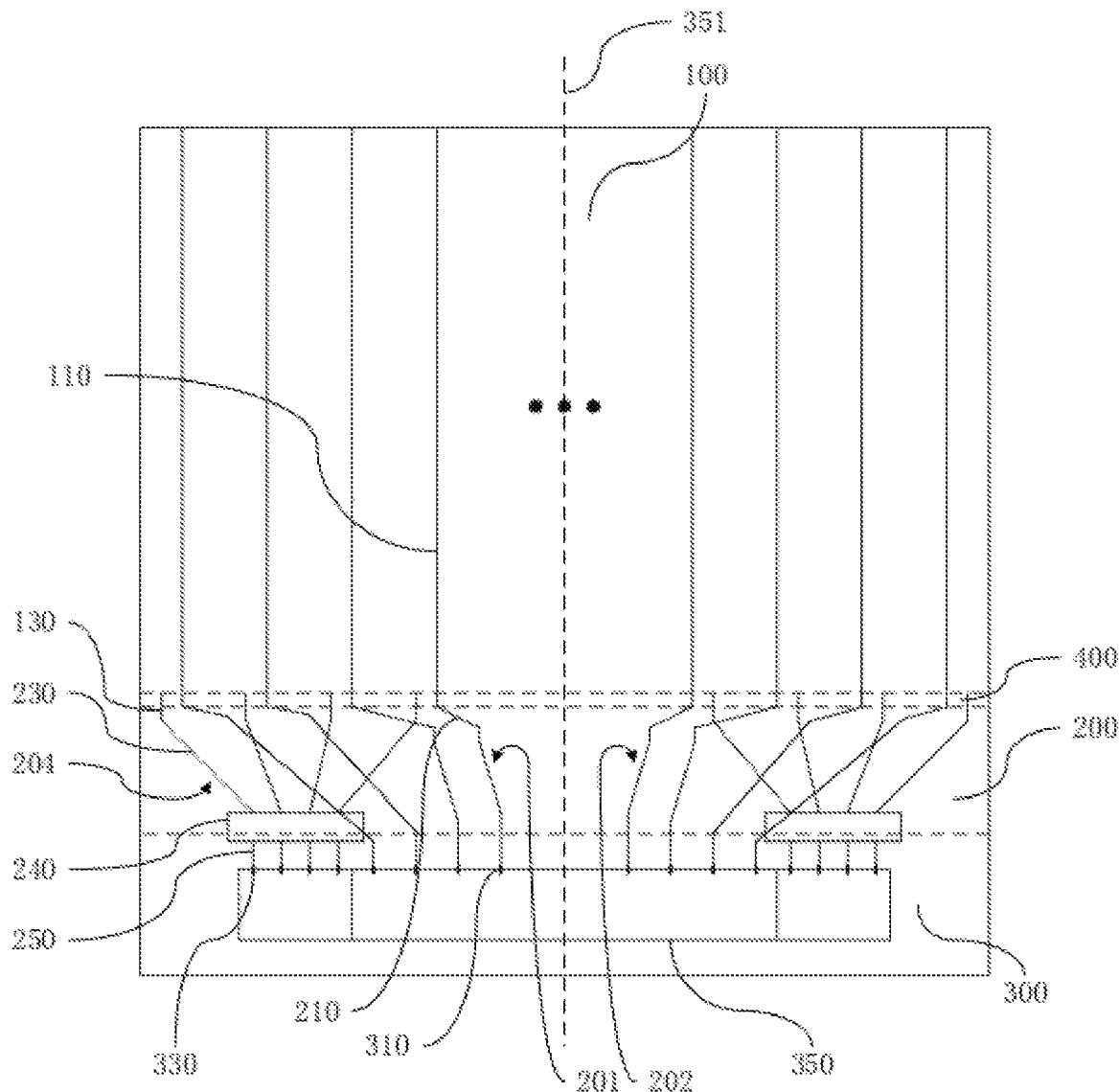
FIG. 6 is a wiring arrangement schematic diagram of the display panel provided in another embodiment of the present application.

In other embodiments of the present application, please refer to FIG. 6 in combination, the above-mentioned display panel further includes a signal conversion circuit 240, a plurality of conversion wirings 250, a plurality of control signal lines 130, a plurality of control signal terminals 330, and a plurality of signal control wirings 230. The common signal lines 120 and the common signal terminals 320 are in one-to-one correspondence with the common wirings 220. One end of each common wiring 220 is connected with the common signal line 120, and another end is connected with the electrical signal of the common signal terminal 320.

The control signal terminals 330 are located in the driving area 300, and each of them acts as a wiring end of the driving circuit 350 in the driving area 300. The common wirings 220 are connected with the electrical signal of the driving circuit 350 through the control signal terminals 330. The control signal terminals 330 are vertically arranged on one side of the driving circuit 350 in parallel, which are also located on one side of the driving circuit 350 facing the display area 100, and on both sides of the data signal terminals 310. In other embodiments, the control signal terminals 330 can also be arranged on one side of the driving circuit 350 away from the display area 100.

The control signal lines 130 are located in the display area 100, and are connected with a corresponding control circuit in the display area 100.

The signal conversion circuit 240, the conversion wirings 250, and the signal control wirings 230 are located in the fan-out area 200.

The plurality of signal control wirings 230 form a plurality of signal control wiring groups 204. The signal control wiring groups 204 and the signal conversion circuit 240 are both arranged on one side of the first fan-out wiring group 201 away from the second fan-out wiring group 202 and one side of the second fan-out wiring group 202 away from the first fan-out wiring group 201. The driving circuit 350 can transmit a control signal to the control circuit in the display area 100 through the signal control wiring groups 204.

The signal conversion circuit 240 is electrically connected with the control signal terminals 330 of the driving circuit 350 through the conversion wirings 250 to convert the electrical signal of the driving circuit 350 into a control signal that can be executed in the display area 100. One end of each signal control wiring 230 is connected with the signal conversion circuit 240, and another end is connected with the control signal line 130, so as to realize electrical connection between the control signal terminal 330 and the control signal line 130. The driving circuit 350 can transmit a signal-control-signal to the display area 100 through the signal control wiring groups 204. The signal-control-signal includes a touch signal, a data distribution signal, or a clock signal, etc.

In above-mentioned embodiments, a bent arrangement of the fan-out wirings 210 makes the fan-out wirings 210 close to the central axis 351, leaving a large amount of space on both sides of the fan-out area 200, which can be used to set various lines and components, so that the fan-out area 200 can accommodate more lines and components in the limited space, increasing functions that can be realized by the display panel, and improving space utilization of the fan-out area 200.

In some embodiments, in the driving area 300, a plurality of driving circuits 350 can be set, and a plurality of driving circuits 350 are arranged at intervals along one side of the display area 100. Accordingly, the display area 100 is also divided into a plurality of sub-display areas along one side opposite to the driving circuits 350. Each sub-display area corresponds to one driving circuit 350 and is connected with the driving circuit 350 through the corresponding fan-out area 200.

For each driving circuit 350 and its corresponding sub-display area, a corresponding fan-out wiring group and other wiring groups are provided to connect the driving circuit 350 and the corresponding sub display area. Other wirings include the above-mentioned common wiring groups 203 or signal control wiring groups 204. In the fan-out area 200 corresponding to each sub-display area, the fan-out wiring groups are symmetrically arranged along the central axis 351, and other wiring groups are arranged on both sides of the fan-out wiring groups.

A display apparatus is provided in the embodiments of the present application, and the display apparatus includes a shell and the display panel provided in the above-mentioned embodiments. Wherein, the display panel is mounted on the shell.

In the display apparatus of the embodiments of the present application, the fan-out wiring 210' with fewer bends are modified to the fan-out wiring 210 with lots of bends, so that the fan-out wirings 210 are close to the central axis of the driving area, so that a difference between lengths of the first section wirings 211 on both sides and a length of the first section wiring 211 close to one side of the central axis is reduced, thus effectively shortening the length of the first section wiring 211 close to the one side of the central axis when the first section wiring 211 on both sides maintains the predetermined length, so that the fan-out area 200 is compressed, and the driving area 300 can be set closer to the display area 100, which effectively shortens a width of the display panel border. To some extent, it solves a technical problem of the wiring mode in the prior art that affects narrowing of the lower border of the display, and realizes the narrowing of the lower border without affecting a wiring width and wiring resistance. After the fan-out area 200 is compressed, space on both sides of the fan-out wirings 210 increases, which can increase wiring space of other wirings, and appropriately increase the wiring width of other wirings to reduce the resistance.

The display apparatus and the display panel thereof provided by the embodiments of the present application are described in detail above. Specific examples are used in this paper to illustrate principles and implementations of this disclosure, description of the above embodiments are only used to help understand method of the present application and its core idea; meanwhile, for those skilled in the art, according to idea of the present application, there will be changes in specific embodiments and scope of application, in conclusion, contents of this specification should not be construed as limiting the present application.

What is claimed is:

1. A display panel, comprising a display area, a fan-out area, and a driving area;
    the fan-out area being arranged on one side of the display area, the driving area being arranged on one side of the fan-out area away from the display area, and the fan-out area being connected with the driving area and the display area;
    the display panel further comprising:
    a plurality of data signal lines located in the display area;
    a plurality of data signal terminals located in the driving area; and
    a plurality of fan-out wirings located in the fan-out area; the fan-out wirings being connected with the data signal lines and the data signal terminals in one-to-one correspondence; wherein, the fan-out wirings at least comprise a first section wiring, a second section wiring, and a third section wiring; the first section wiring is connected with the data signal terminals, the third section wiring is connected with the data signal lines, and the second section wiring is connected with the first section wiring and the third section wiring; the third section wiring extends from the display area to the driving area along a direction at an oblique angle to a horizontal line perpendicular to a central axis of the display panel, an extending direction of the first section wiring and an extending direction of the second section wiring are different, and the extending direction of the second section wiring and an extending direction of the third section wiring are different; wherein, each fan-out wiring further comprises a fourth section wiring, and the fourth section wiring is connected with the second section wiring and the third section wiring; the fourth section wiring of each fan-out wiring is arranged in parallel along a first direction, and the first direction is directed from the display area to the driving area.

2. The display panel as claimed in claim 1, wherein, an orthogonal projection length of each third section wiring on a reference line coplanar with the third section wiring is less than a distance between adjacent two data signal lines; wherein an extending direction of the reference line is perpendicular to an extending direction of the central axis of the display panel.

3. The display panel as claimed in claim 1, wherein, a first endpoint of the fourth section wiring of each fan-out wiring is located on a first straight line extending along a second direction, a second endpoint of the fourth section wiring of each fan-out wiring is located on a second straight line extending along the second direction, and the second direction intersects the first direction.

4. The display panel as claimed in claim 3, wherein, the plurality of fan-out wirings comprise a plurality of fan-out wiring groups symmetrical about the central axis of the display panel; in at least one fan-out wiring group, the second section wiring of each fan-out wiring is arranged in parallel, and the central axis coincides with a central line of the fan-out area and the driving area.

5. The display panel as claimed in claim 4, wherein, in at least one fan-out wiring group, in the direction pointing from the side of the display panel away from the central axis of the display panel to the central axis, lengths of the first section wirings of at least two fan-out wirings increase progressively.

6. The display panel as claimed in claim 4, wherein, in at least one fan-out wiring group, the first section wirings of the fan-out wirings are arranged at equal intervals, the second section wirings of the fan-out wirings are arranged at equal intervals, and the fourth section wirings of the fan-out wirings are arranged at equal intervals.

7. The display panel as claimed in claim 6, wherein, in at least one fan-out wiring group, a first distance between the first section wirings of adjacent two fan-out wirings is less than a second distance between the fourth section wirings of the adjacent two fan-out wirings, and the second distance is less than a third distance between wiring portions of the adjacent two fan-out wirings.

8. The display panel as claimed in claim 1, wherein, a fourth distance of the second section wirings of adjacent two fan-out wirings is less than a first distance of the first section wirings of the adjacent two fan-out wirings.

9. A display apparatus, wherein, comprising: a shell; a display panel mounted on the shell and at least comprising a display area, a fan-out area, and a driving area; the fan-out area being arranged on one side of the display area, the driving area being arranged on one side of the fan-out area away from the display area, and the fan-out area being connected with the driving area and the display area; the display panel further comprising: a plurality of data signal lines located in the display area; a plurality of data signal terminals located in the driving area; and a plurality of fan-out wirings located in the fan-out area; the fan-out wirings being connected with the data signal lines and the data signal terminals in one-to-one correspondence; wherein, the fan-out wirings at least comprise a first section wiring, a second section wiring, and a third section wiring; the first section wiring is connected with the data signal terminals, the third section wiring is connected with the data signal lines, and the second section wiring is connected with the first section wiring and the third section wiring; the third section wiring extends from the display area to the driving area along a direction at an oblique angle to a horizontal line perpendicular to a central axis of the display panel, an extending direction of the first section wiring and an extending direction of the second section wiring are different, and the extending direction of the second section wiring and an extending direction of the third section wiring are different; wherein, each fan-out wiring further comprises a fourth section wiring, and the fourth section wiring is connected with the second section wiring and the third section wiring; the fourth section wiring of each fan-out wiling is arranged in parallel along a first direction, and the first direction is directed from the display area to the driving area.

10. The display apparatus as claimed in claim 9, wherein, an orthogonal projection length of each third section wiring on a reference line coplanar with the third section wiring is less than a distance between adjacent two data signal lines; wherein an extending direction of the reference line is perpendicular to an extending direction of the central axis of the display panel.

11. The display apparatus as claimed in claim 9, wherein, a first endpoint of the fourth section wiring of each fan-out wiring is located on a first straight line extending along a second direction, a second endpoint of the fourth section wiring of each fan-out wiring is located on a second straight line extending along the second direction, and the second direction intersects the first direction.

12. The display apparatus as claimed in claim 11, wherein, the plurality of fan-out wirings comprise a plurality of fan-out wiring groups symmetrical about the central axis of the display panel; in at least one fan-out wiring group, the second section wiring of each fan-out wiring is arranged in parallel, and the central axis coincides with a central line of the fan-out area and the driving area.

13. The display apparatus as claimed in claim 12, wherein, in at least one fan-out wiring group, in the direction pointing from the side of the display panel away from the central axis of the display panel to the central axis, lengths of the first section wirings of at least two fan-out wirings increase progressively.

14. The display apparatus as claimed in claim 12, wherein, in at least one fan-out wiring group, the first section wirings of the fan-out wirings are arranged at equal intervals, the second section wirings of the fan-out wirings are arranged at equal intervals, and the fourth section wirings of the fan-out wirings are arranged at equal intervals.

15. The display apparatus as claimed in claim 14, wherein, in at least one fan-out wiring group, a first distance between the first section wirings of adjacent two fan-out wirings is less than a second distance between the fourth section wirings of the adjacent two fan-out wirings, and the second distance is less than a third distance between wiring portions of the adjacent two fan-out wirings.

16. The display apparatus as claimed in claim 9, wherein, a fourth distance of the second section wirings of adjacent two fan-out wirings is less than a first distance of the first section wirings of the adjacent two fan-out wirings.

* * * * *